(12) United States Patent
Wagemans et al.

(10) Patent No.: US 9,891,429 B2
(45) Date of Patent: Feb. 13, 2018

(54) CONTROLLABLE POLYMER ACTUATOR

(71) Applicant: PHILIPS LIGHTING HOLDING B.V., Eindhoven (NL)

(72) Inventors: Wiebe Wagemans, Eindhoven (NL); Dirk Brokken, Nuenen (NL); Floris Maria Hermansz Crompvoets, Bunde (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 69 days.

(21) Appl. No.: 14/367,588

(22) PCT Filed: Dec. 18, 2012

(86) PCT No.: PCT/IB2012/057412
§ 371 (c)(1),
(2) Date: Jun. 20, 2014

(87) PCT Pub. No.: WO2013/093766
PCT Pub. Date: Jun. 27, 2013

(65) Prior Publication Data
US 2014/0333992 A1 Nov. 13, 2014

Related U.S. Application Data

(60) Provisional application No. 61/578,426, filed on Dec. 21, 2011.

(51) Int. Cl.
*G02F 1/29* (2006.01)
*G02B 26/08* (2006.01)
(Continued)

(52) U.S. Cl.
CPC ...... *G02B 26/0875* (2013.01); *H01L 41/0471* (2013.01); *H01L 41/09* (2013.01);
(Continued)

(58) Field of Classification Search
CPC . G02B 26/0875; H01L 41/0471; H01L 41/09; H01L 41/0986; H01L 41/193;
(Continued)

(56) References Cited

U.S. PATENT DOCUMENTS 7,608,976 B1 * 10/2009 Cheng ............... H01L 41/08
310/311
7,719,164 B2  5/2010 Gologanu et al.
(Continued)

FOREIGN PATENT DOCUMENTS

EP   2244489 A1   10/2010
EP   2385562 A1   11/2011
(Continued)

*Primary Examiner* — Bumsuk Won
*Assistant Examiner* — Tamara Y Washington

(57) ABSTRACT

A controllable polymer actuator (1) comprising a dielectric elastomeric film (2); a first (3) and a second (4) deformable electrode arranged on opposite sides of the dielectric elastomeric film such that application of a voltage between the electrodes causes an active portion (7) of the controllable polymer actuator to change topography. The controllable polymer actuator (1) further comprises a deformation controlling layer (5, 6) connected to the dielectric elastomeric film. The deformation controlling layer at least locally has a higher stiffness than the dielectric elastomeric film, and exhibits a spatially varying stiffness across the active portion (7). This may enable surface topographies that could not at all be achieved using previously known controllable polymer actuators and/or may enable a certain surface topography to be achieved with a simpler electrode pattern and/or fewer individually controllable electrodes.

11 Claims, 3 Drawing Sheets

(51) Int. Cl.
 *H01L 41/09* (2006.01)
 *H01L 41/193* (2006.01)
 *H01L 41/047* (2006.01)
 *H01L 41/331* (2013.01)
 *H01L 41/35* (2013.01)
 *H01L 41/45* (2013.01)

(52) U.S. Cl.
 CPC ........ *H01L 41/0986* (2013.01); *H01L 41/193* (2013.01); *H01L 41/331* (2013.01); *H01L 41/35* (2013.01); *H01L 41/45* (2013.01); *Y10T 29/42* (2015.01)

(58) Field of Classification Search
 CPC ....... H01L 41/331; H01L 41/35; H01L 41/45; Y10T 29/42
 USPC .................................................. 359/315–320
 See application file for complete search history.

(56) References Cited

U.S. PATENT DOCUMENTS

| | | | |
|---|---|---|---|
| 7,920,330 B2 | 4/2011 | Aschwanden et al. | |
| 7,948,152 B2 | 5/2011 | Arndt et al. | |
| 7,969,645 B2 | 6/2011 | Wik et al. | |
| 9,081,190 B2* | 7/2015 | Holman | G02B 26/0875 |
| 9,224,985 B2* | 12/2015 | Setz | H01L 51/5275 |
| 9,523,797 B2* | 12/2016 | Yun | G02B 3/0043 |
| 2005/0040733 A1* | 2/2005 | Goldenberg | F04B 43/09 |
| | | | 310/328 |
| 2006/0072181 A1 | 4/2006 | Goossens | |
| 2008/0289952 A1 | 11/2008 | Peirine et al. | |
| 2009/0161239 A1 | 6/2009 | Verhaar et al. | |
| 2009/0303613 A1 | 12/2009 | Kinoshita et al. | |
| 2010/0171393 A1 | 7/2010 | Pei et al. | |
| 2012/0032443 A1 | 2/2012 | Hehenberger | |
| 2012/0224247 A1* | 9/2012 | Sotzing | D06P 1/0056 |
| | | | 359/265 |
| 2012/0250151 A1* | 10/2012 | Lee | G02B 27/2214 |
| | | | 359/463 |
| 2014/0197936 A1* | 7/2014 | Biggs | H02K 33/00 |
| | | | 340/407.1 |

FOREIGN PATENT DOCUMENTS

| | | | | |
|---|---|---|---|---|
| NL | EP 2385562 A1 * | 11/2011 | | G06F 3/016 |
| WO | 2012032443 A1 | 3/2012 | | |

\* cited by examiner

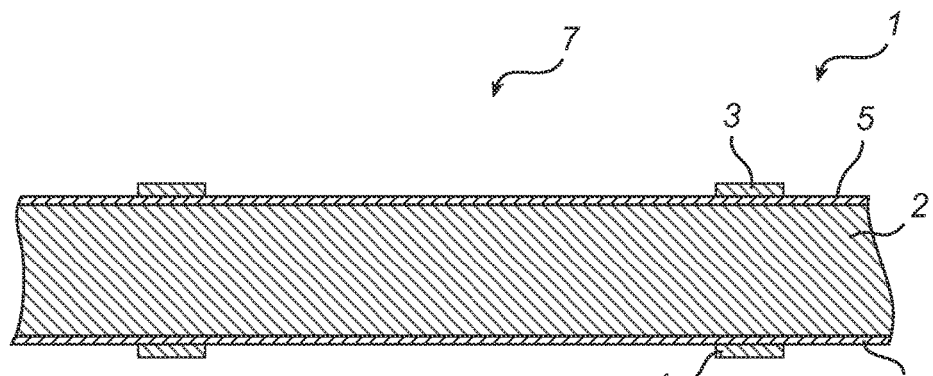
A - A  *Fig. 3a*
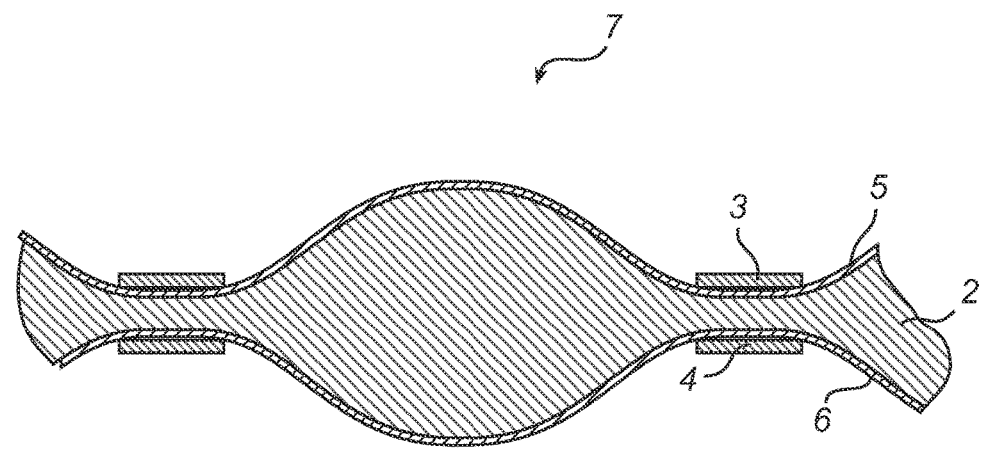
A - A  *Fig. 3b*
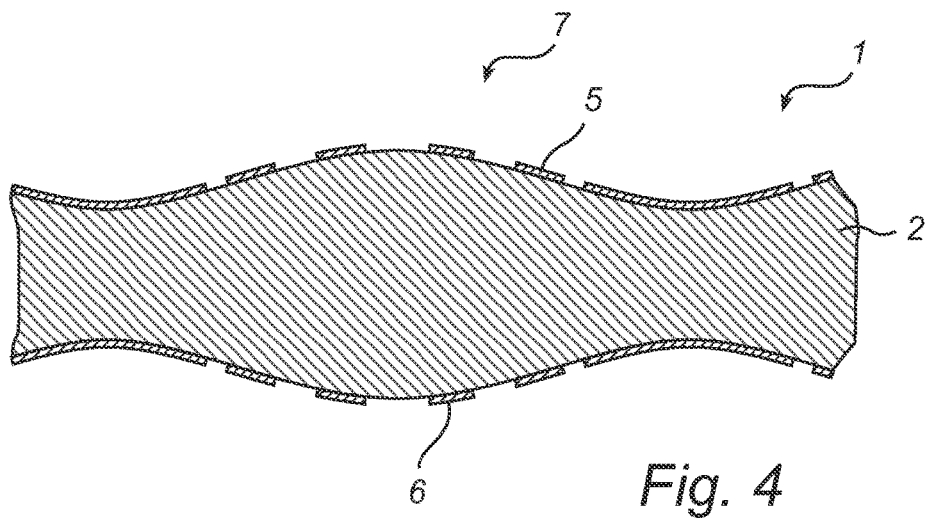
*Fig. 4*

CONTROLLABLE POLYMER ACTUATOR

CROSS-REFERENCE TO PRIOR APPLICATIONS

This application is the U.S. National Phase application under 35 U.S.C. § 371 of International Application No. PCT/IB12/057412, filed on Dec. 18, 2012, which claims the benefit of [e.g., U.S. Provisional Patent Application No. or European Patent Application No.] 61/578,426, filed on Dec. 21, 2011. These applications are hereby incorporated by reference herein.

FIELD OF THE INVENTION

The present invention relates to a controllable polymer actuator and to a method of manufacturing such a controllable polymer actuator.

BACKGROUND OF THE INVENTION

Polymer actuators or electroactive polymers (EAP) offer the unique possibility to generate thin-film actuating surfaces. This can be used for many different applications, such as, for example, controllable optical elements, so-called electronic muscles, and applications where a controllable surface topography is used to modify the appearance and/or tactile properties of a surface.

Polymer actuators typically comprise a dielectric elastomeric film sandwiched between two deformable electrodes. When a voltage is applied between the electrodes, an electrostatic force is generated that strives to push the electrodes closer to each other. When this happens, the portion of the dielectric elastomeric film between the electrodes is compressed until the compression force balances the electrostatic force, at which point the dielectric elastomeric film has (at least locally) become thinner. Due to the incompressibility of the dielectric elastomeric film, a local thickness reduction translates to a change in another dimension of the polymer actuator. By properly selecting electrode geometry and controlling the voltage applied between the electrodes, the surface topography of the polymer actuator can be controlled by applying the between the electrodes. The control of the surface topography is, however, limited by the properties of the dielectric elastomeric film and the configuration of the electrodes.

In order to expand the controllable range, at least in terms of amplitude, US-2008/0289952 discloses to provide a passive layer on top of one or both sides of a stack formed by the dielectric elastomeric film and control electrodes. The passive layer is softer than the dielectric elastomeric film in order to amplify out-of-plane deformations and create more visible surface features.

Although providing for an increased range of control for out-of-plane deformation, the polymer actuator according to US-2008/0289952 is still limited to controlling the locations of the deformations through the electrode geometry, which may make it difficult and/or complicated to achieve certain surface topographies.

SUMMARY OF THE INVENTION

In view of the above-mentioned and other drawbacks of the prior art, a general object of the present invention is to provide an improved controllable polymer actuator, in particular facilitating control of the surface topography of the controllable polymer actuator.

According to a first aspect of the present invention there is provided a controllable polymer actuator comprising: a dielectric elastomeric film; a first deformable electrode on a first side of the dielectric elastomeric film; and a second deformable electrode on a second side of the dielectric elastomeric film, at least partly opposite the first deformable electrode, the first and second deformable electrodes being arranged such that application of a voltage between the electrodes causes an active portion of the controllable polymer actuator to become change topography, wherein the controllable polymer actuator further comprises a deformation controlling layer connected to the dielectric elastomeric film, the deformation controlling layer at least locally having a higher stiffness than the dielectric elastomeric film and exhibiting a spatially varying stiffness across the active portion in a stiffness pattern configured to control a curvature of the active portion when a voltage is applied between the electrodes.

That the deformation controlling layer is "connected to" the dielectric elastomeric film should, in the context of the present application, be understood to mean that there is a direct or indirect mechanical connection between the deformation controlling layer and the dielectric elastomeric film, such that a force acting on the dielectric elastomeric film results in a force acting on the deformation controlling layer.

The "stiffness" of the deformation controlling layer is determined by the thickness and material properties (specifically the elastic modulus) of the deformation controlling layer.

It should be noted that the "stiffness pattern" need not be a repeated structure, but may be an irregular pattern of portions with different stiffness.

The present invention is based on the realization that improved control of the surface topography of a controllable polymer actuator can be achieved by providing the controllable polymer actuator with a spatially varying (across the surface of the controllable polymer actuator) stiffness, so that a given displacement of material of the dielectric elastomeric film results in a curvature that is determined by the pattern selected for the spatially varying stiffness. The present inventors have further realized that such a spatially varying stiffness may advantageously be achieved by providing a deformation controlling layer having a higher stiffness than the dielectric elastomeric film and exhibiting a spatially varying stiffness across the active portion of the controllable polymer actuator.

With the deformation controlling layer, a further design tool is provided to the engineer designing a controllable polymer actuator for achieving a desired surface topography when a voltage is applied between the deformable electrodes. This may enable surface topographies that could not at all be achieved using previously known controllable polymer actuators and/or may enable a certain surface topography to be achieved with a simpler electrode pattern and/or fewer individually controllable electrodes. Accordingly various embodiments of the present invention provide for increased functionality and/or reduced cost and complexity. Through the provision of the deformation controlling layer, some deformation is sacrificed for greater control of the topography. This may be of particular importance in applications where the controllable polymer actuator is a controllable optical element since, in such devices, small changes in the curvature/topography can have large effects on the optical performance.

According to various embodiments of the present invention, the controllable polymer actuator may be at least partly optically transparent, so that it can function as a controllable optical element that is switchable between optical states through application of a voltage between the deformable electrodes. To that end, at least the dielectric elastomeric film and the deformation controlling layer may be optically transparent. Advantageously, also the deformable electrodes may be optically transparent.

The spatially varying stiffness of the deformation controlling layer may be achieved in different ways. For example, the deformation controlling layer may exhibit a spatially varying thickness, to thereby achieve said spatially varying stiffness.

According to one embodiment, the deformation controlling layer may be provided as a patterned layer having a first set of portions with a first thickness and a second set of portions with a second thickness different from the first thickness. For example, the deformation controlling layer may be provided in a pattern where the second thickness is substantially zero, which means that the local average stiffness is determined by the local average surface coverage of the first set of portions.

According to various embodiments, the above-mentioned active portion may substantially be defined by at least one edge of at least one of the deformable electrodes. In these embodiments, application of a voltage between the deformable electrodes will cause the dielectric elastomeric film between the deformable electrodes to be compressed, which will result in an increased thickness of the dielectric elastomeric film next to the edge of the deformable electrodes.

In some of these embodiments, the deformation controlling layer may exhibit a stiffness gradient being substantially perpendicular to the at least one edge of the at least one deformable electrode.

Hereby, it can be ensured that the curvature control of the deformation controlling layer works in unison with the deformation caused by the application of the voltage between the deformable electrodes, which provides for improved control of the surface topography of the controllable polymer actuator.

Furthermore, the deformation controlling layer may exhibit a reduced stiffness with increasing distance from the at least one edge of the at least one deformable electrode. Hereby, a controlled curvature of the controllable polymer actuator can be achieved, which may be particularly useful for optical applications.

Alternatively, the deformable electrodes may uniformly cover the entire active portion, and the configuration of the active portion upon application of a voltage between the deformable electrodes be practically exclusively controlled by the stiffness pattern of the deformation controlling layer.

The deformation controlling layer may be arranged anywhere in the controllable polymer actuator stack further comprising the dielectric elastomeric film and the deformable electrodes.

Providing the deformation controlling layer between the dielectric elastomeric film and the first and/or second deformable electrode or on top of the first and/or second deformable electrode may be most straight-forward in the manufacturing of the controllable polymer actuator.

It may, however, be advantageous to provide the deformation controlling layer inside the dielectric elastomeric film, since this may reduce optical scattering caused by the deformation controlling layer. The deformation controlling layer may, for example, be provided inside the dielectric elastomeric film by providing the deformation controlling layer on a first dielectric elastomeric sheet and then sandwiching the deformation controlling layer between the first dielectric elastomeric sheet and a second dielectric elastomeric sheet.

According to various embodiments, furthermore, the controllable polymer actuator may comprise a first deformation controlling layer arranged on a first side of the dielectric elastomeric film and a second deformation controlling layer arranged on a second side of the dielectric elastomeric film, opposite the first side. The first and the second deformation controlling layers may be substantially identical for achieving a symmetric surface topography of the controllable polymer actuator, or the first and the second deformation controlling layers may be different, in order to achieve different curvatures on the different sides of the controllable polymer actuator.

Moreover, the controllable polymer actuator may further comprise a framing structure arranged to keep a lateral dimension of the controllable polymer actuator substantially constant upon application of the voltage between the deformable electrodes. Hereby, improved control of the surface topography can be achieved. The framing structure may, for example, be provided as an external structure (a clamping frame).

According to a second aspect of the present invention, there is provided a method of manufacturing a controllable polymer actuator, comprising the steps of providing an polymer actuator stack comprising a dielectric elastomeric film; a first deformable electrode on a first side of the dielectric elastomeric film; and a second deformable electrode on a second side of the dielectric elastomeric film, at least partly opposite the first deformable electrode, the first and second deformable electrodes being arranged such that application of a voltage between the electrodes causes an active portion of the polymer actuator stack to become thicker; and providing a deformation controlling layer in connection with the polymer actuator stack, the deformation controlling layer being stiffer than the dielectric elastomeric film and exhibiting a spatially varying stiffness across the active portion in a pattern configured to control a curvature of the active portion when a voltage is applied between the electrodes.

The deformation controlling layer may advantageously be provided through inkjet printing of a polymer material according to a spatially varying pattern.

Variations and advantages of this second aspect of the present invention are largely analogous to those provided above in connection with the first aspect of the invention.

BRIEF DESCRIPTION OF THE DRAWINGS

These and other aspects of the present invention will now be described in more detail, with reference to the appended drawings showing currently preferred embodiments of the invention, wherein:

FIGS. 3a and 3b are partial section views of a section taken along the line A-A' in FIG. 2 illustrating the controllable optical element in an off state and an on state, respectively;

FIG. 4 is a partial section views of a section taken along the line B-B' in FIG. 2 illustrating the controllable optical element in the on state;

DETAILED DESCRIPTION OF THE EMBODIMENTS

In the following description, the present invention is described with reference to a controllable optical element comprising an optically transparent controllable polymer actuator stack.

It should be noted that this by no means limits the scope of the invention, which is equally applicable to other controllable polymer actuators that may, for example, be useful for tactile applications and/or for controllably forming a reflective pattern.

Figure 1:
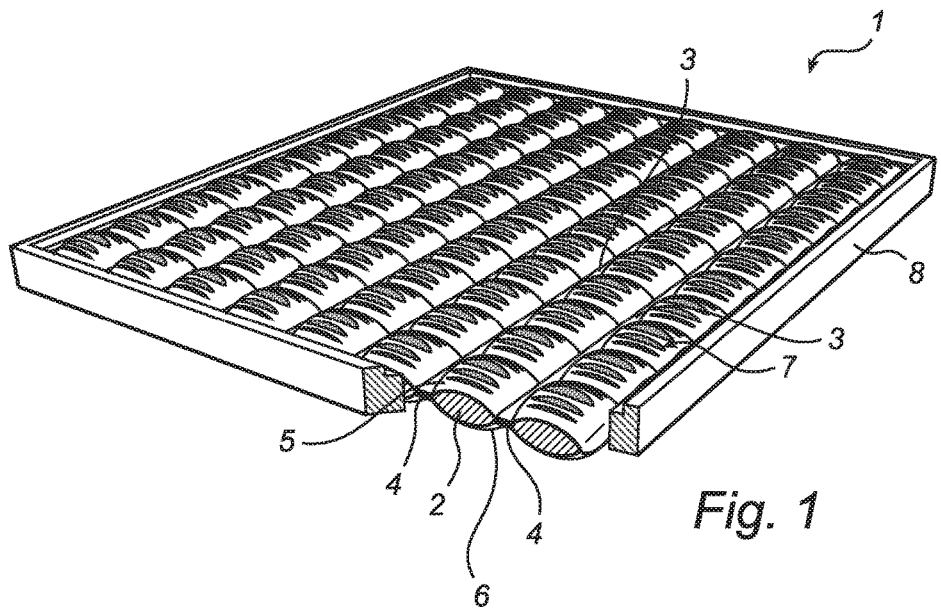
FIG. 1 is a perspective view of a controllable polymer actuator, in the form of a controllable optical element, according to an exemplary embodiment of the present invention.

FIG. 1 schematically illustrates a controllable optical element 1 in the form of a lens array that is at least controllable between a flat state and a lenticular state, as is schematically illustrated in FIG. 1. The controllable optical element 1 comprises a dielectric elastomeric film 2, a first deformable electrode 3, a second deformable electrode 4, a first deformation controlling layer 5 and a second deformation controlling layer 6. The first 3 and second 4 deformable electrodes are provided on opposite sides of the dielectric elastomeric film 2. When a voltage is applied between the first 3 and second 4 deformable electrodes using a voltage source (not shown in FIG. 1), an electrostatic force will cause the dielectric elastomeric film between the first 3 and second 4 deformable electrodes to be compressed, as is schematically indicated in FIG. 1. Each of the first 5 and second 6 deformation controlling layers has a higher stiffness than the dielectric elastomeric film 2 and exhibits a spatially varying stiffness across an active portion 7 (to avoid cluttering the drawing, only one active portion is indicated in FIG. 1) of the controllable optical element 1. As is schematically indicated in FIG. 1, the controllable optical element 1 further comprises a frame 8 arranged to fix the outer perimeter of the dielectric elastomeric film 2.

As will be described in more detail below, the spatially varying stiffness of the first 5 and second 6 deformation controlling layers is provided in the form of stiffness patterns that are configured to control the curvature of the active portion 7 when the voltage is applied between the first 3 and second 4 deformable electrodes. In the exemplary controllable polymer actuator in FIG. 1, the stiffness patterns of the first 5 and second 6 deformation controlling layers are identical, but for various embodiments, the stiffness patterns may be different.

Figure 2:
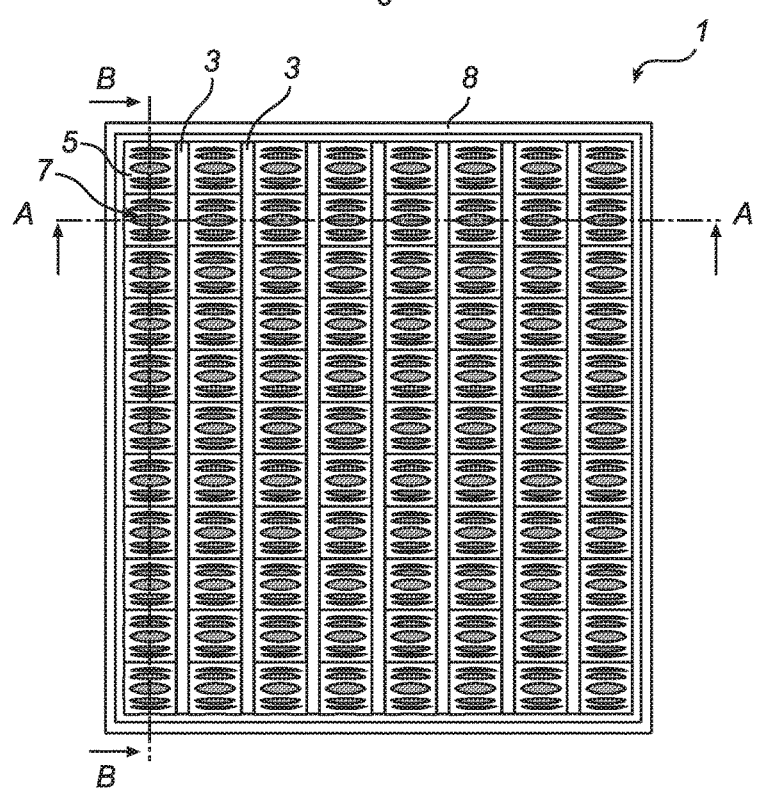
FIG. 2 is a schematic top view of the controllable optical element in FIG. 1.

In FIG. 2, which is a schematic plane view from the top of the controllable optical element 1 in FIG. 1, the configuration of the first deformation controlling layer 5 is illustrated by a spatially varying pattern, where light areas indicate higher stiffness and dark areas indicate lower stiffness.

When a voltage is applied between the first 3 and second 4 deformable electrodes, the curvature of the active portion(s) 7 will be determined by the pattern(s) of the first 5 and second 6 deformation controlling layers. This will now be further described with reference to FIGS. 3a-b and FIG. 4.

FIGS. 3a-b are schematic partial cross-section views of the controllable optical element 1 of a section taken along the line A-A' in FIG. 2. FIG. 3a illustrates the controllable optical element 1 in an "off state" (when no voltage is applied between the first 3 and second 4 deformable electrodes), and FIG. 3b illustrates the controllable optical element 1 in an "on state" (when a voltage is applied between the first 3 and second 4 deformable electrodes).

In the off state, there is no electrostatic force acting between the first 3 and second 4 deformable electrodes, which means that the optical element 1 will by undeformed, as is schematically illustrated in FIG. 3a.

In the on state, when a voltage is applied between the first 3 and second 4 deformable electrodes, an electrostatic force (indicated by the arrows in FIG. 3b) will pull the first 3 and second 4 deformable electrodes together until the electrostatic force is balanced by the force caused by the deformation of the dielectric elastomeric film 2. This will cause material to move from the portions of the dielectric elastomeric film between the first 3 and second 4 deformable electrodes towards the active portion 7. As is schematically illustrated in FIG. 3b and as will be described further below with reference to FIG. 4, the curvature of the active portion 7 will be determined by the configuration of the deformation controlling layers 5, 6.

As is schematically indicated in FIG. 4, which is a schematic partial cross-section view of the controllable optical element 1 of a section taken along the line B-B' in FIG. 2, the curvature of the active portion 7 along the line B-B' in FIG. 2 is not uniform, but is determined by the configuration or pattern of the first 5 and second 6 deformation controlling layers.

Through the stiffness pattern indicated in FIG. 1 and FIG. 2, the surface topography of the controllable polymer actuator can be controlled in two dimensions through the application of a voltage between electrodes 3, 4 extending in one dimension. To achieve other types of surface topography, other stiffness patterns may be used. Various examples of stiffness patterns will now be briefly described with reference to FIG. 5, FIG. 6, FIG. 7 and FIG. 8.

Figure 5:
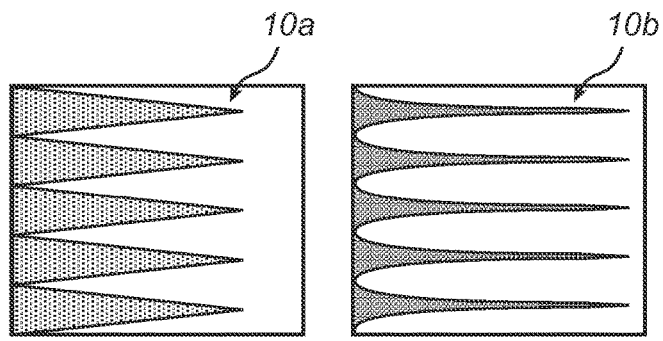
FIG. 5 schematically illustrates a first set of exemplary patterns of the deformation controlling layer for different embodiments of the controllable polymer actuator according to the present invention.

In FIG. 5, two different schematic examples are shown, where the stiffness decreases from left to right in the Figs. through the provision of wedge patterns 10a-b with decreasing widths.

Figure 6:
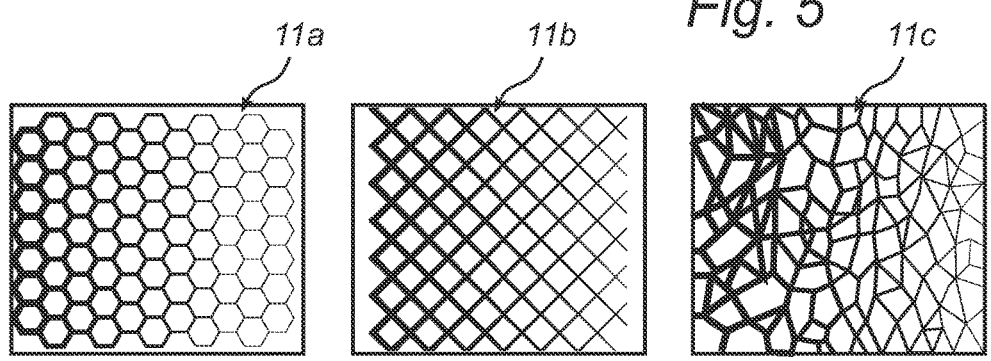
FIG. 6 schematically illustrates a second set of exemplary patterns of the deformation controlling layer for different embodiments of the controllable polymer actuator according to the present invention.

In FIG. 6, three different schematic examples are shown, where the stiffness decreases from left to right in the Figs. through the provision of grid patterns 11a-c formed using lines with decreasing widths.

Figure 7:
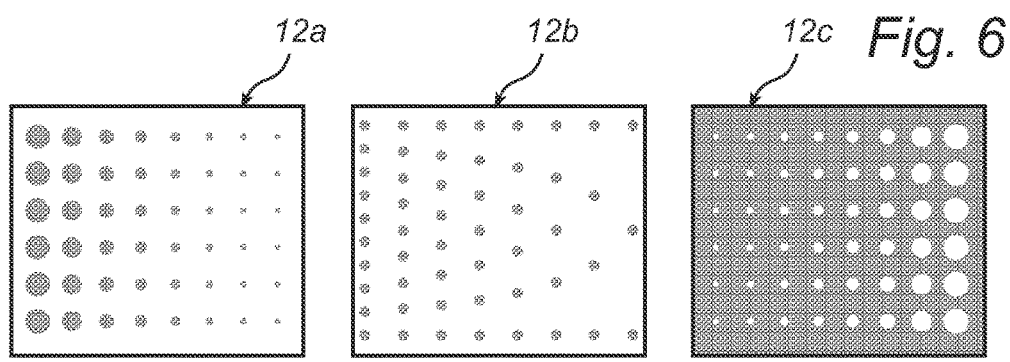
FIG. 7 schematically illustrates a third set of exemplary patterns of the deformation controlling layer for different embodiments of the controllable polymer actuator according to the present invention.

In FIG. 7, three different schematic examples are shown, where the stiffness decreases from left to right in the Figs. through the provision of patterns 12a-c with decreasing densities.

Figure 8:
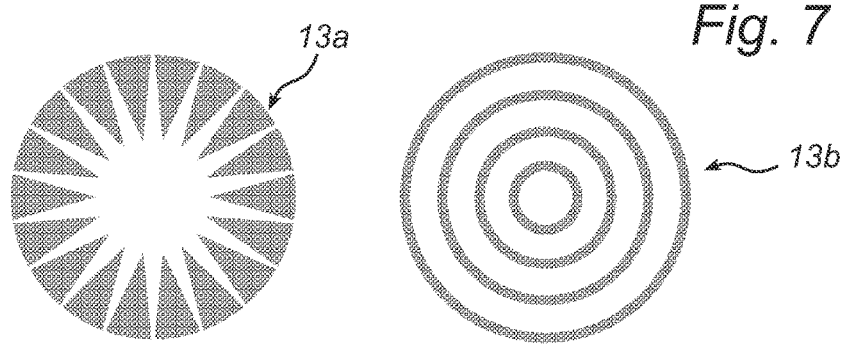
FIG. 8 schematically illustrates a fourth set of exemplary patterns of the deformation controlling layer for different embodiments of the controllable polymer actuator according to the present invention.

Finally, FIG. 8 schematically shows two examples of stiffness patterns 13a-b exhibiting circular symmetry.

Additionally, variations to the disclosed embodiments can be understood and effected by the skilled person in practicing the claimed invention, from a study of the drawings, the disclosure, and the appended claims. For example, the stiffness pattern can be achieved in other ways, such as by providing a polymer layer and irradiating a desired pattern with UV light to locally increase the stiffness in the irradiated portions. Moreover, other patterns, including non-periodic structures. Additionally, each of the various layers may comprise multiple sub-layers, and various layers may comprise of different portions or segments with different elastic moduli.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A controllable polymer actuator comprising:
   a dielectric elastomeric film,
   a first deformable electrode on a first side of the dielectric elastomeric film, and
   a second deformable electrode on a second side of the dielectric elastomeric film, at least partly opposite the first deformable electrode, wherein the first and second deformable electrodes are arranged such that application of a voltage between the first and second deformable electrodes causes an active portion of the controllable polymer actuator to change topography,
   wherein the controllable polymer actuator further comprises:
   a deformation controlling layer connected to the dielectric elastomeric film,
   wherein the deformation controlling layer at least locally has a higher stiffness than the dielectric elastomeric film, and
   wherein the deformation controlling layer exhibits a spatially varying stiffness across at least one direction of the surface of the active portion in a stiffness pattern configured to control a curvature of the active portion when a voltage is applied between the first and second deformable electrodes, and
   wherein the controllable polymer actuator is optically transparent such that the controllable polymer actuator is switchable between a flat state and a lenticular state through application of the voltage between the electrodes, wherein, in the lenticular state, the controllable polymer actuator defines a plurality of lenses, an optical property of each lens of the plurality of lenses being determined by the curvature of the active portion.

2. The controllable polymer actuator according to claim 1, wherein the deformation controlling layer exhibits a spatially varying thickness, to thereby achieve the spatially varying stiffness.

3. The controllable polymer actuator according to claim 2, wherein the active portion is substantially defined by at least one edge of at least one of the deformable electrodes.

4. The controllable polymer actuator according to claim 3, the deformation controlling layer exhibiting a stiffness gradient being substantially perpendicular to the at least one edge of the at least one deformable electrode.

5. The controllable polymer actuator according to claim 3, wherein the deformation controlling layer exhibits a reduced stiffness with increasing distance from the at least one edge of the at least one deformable electrode.

6. The controllable polymer actuator according to claim 5, wherein the deformation controlling layer is arranged inside the dielectric elastomeric film.

7. The controllable polymer actuator according to claim 6, comprising a first deformation controlling layer arranged on a first side of the dielectric elastomeric film and a second deformation controlling layer arranged on a second side of the dielectric elastomeric film, opposite the first side.

8. The controllable polymer actuator according to claim 7, wherein the first deformation controlling layer exhibits a spatially varying stiffness according to a first pattern, and the second deformation controlling layer exhibits a spatially varying stiffness according to a second pattern, different from the first pattern.

9. The controllable polymer actuator according to claim 8, further comprising a framing structure arranged to keep a lateral dimension of the controllable polymer actuator substantially constant upon application of the voltage between the deformable electrodes.

10. A method of manufacturing the controllable polymer actuator according to claim 1, comprising the steps of:
    providing an polymer actuator stack comprising a dielectric elastomeric film; a first deformable electrode on a first side of the dielectric elastomeric film; and a second deformable electrode on a second side of the dielectric elastomeric film, at least partly opposite the first deformable electrode, the first and second deformable electrodes being arranged such that application of a voltage between the electrodes causes an optically transparent active portion of the polymer actuator stack to change topography; and
    providing a deformation controlling layer in connection with the polymer actuator stack, the deformation controlling layer being stiffer than the dielectric elastomeric film and exhibiting a spatially varying stiffness across at least one direction of the surface of the active portion in a pattern configured to control a curvature of the active portion when a voltage is applied between the electrodes;
    applying a voltage between the electrodes to switch the controllable polymer actuator between a flat state and a lenticular state, wherein, in the lenticular state, the controllable polymer actuator defines a plurality of lenses, wherein an optical property each lens of the plurality of lenses is determined by the curvature of the active portion.

11. The method according to claim 10, wherein the deformation controlling layer is provided through inkjet printing of a polymer material according to a spatially varying pattern.

* * * * *